(12) United States Patent
Sung

(10) Patent No.: US 6,355,943 B1
(45) Date of Patent: Mar. 12, 2002

(54) THIN FILM TRANSISTOR, METHOD OF PRODUCING THE SAME, LIQUID CRYSTAL DISPLAY, AND THIN FILM FORMING APPARATUS

(75) Inventor: Chae Gee Sung, Miyagi-ken (JP)

(73) Assignee: LG. Philips LCD Co., Ltd., Seoul (KR)

( * ) Notice: Subject to any disclaimer, the term of this patent is extended or adjusted under 35 U.S.C. 154(b) by 0 days.

(21) Appl. No.: 09/413,653

(22) Filed: Oct. 6, 1999

(30) Foreign Application Priority Data

Oct. 7, 1998 (JP) .......................................... 10-285776
Aug. 27, 1999 (JP) .......................................... 11-242360

(51) Int. Cl.$^7$ ............................................. H01L 29/04
(52) U.S. Cl. .......................... 257/72; 257/57; 257/324; 257/347; 349/42; 349/46
(58) Field of Search ............................ 257/57, 59, 66, 257/63, 72, 347–354, 324, 411; 349/42, 43, 46

(56) References Cited

U.S. PATENT DOCUMENTS

| | | | | |
|---|---|---|---|---|
| 5,686,980 A | * | 11/1997 | Hirayama et al. | 349/110 |
| 6,005,651 A | * | 12/1999 | Takahara et al. | 349/137 |
| 6,057,896 A | * | 5/2000 | Rho et al. | 349/42 |
| 6,097,038 A | * | 8/2000 | Jinno | 257/57 |

FOREIGN PATENT DOCUMENTS

| | | | |
|---|---|---|---|
| JP | 363117469 A | * | 5/1988 |
| JP | 402034821 | * | 2/1990 |
| JP | 404171418 | * | 6/1992 |
| JP | 405114740 A | * | 5/1993 |
| JP | 407183395 A | * | 7/1995 |

* cited by examiner

Primary Examiner—Nathan Flynn
Assistant Examiner—Remmon R. Fordé
(74) Attorney, Agent, or Firm—Brinks Hofer Gilson & Lione

(57) ABSTRACT

The invention intends to provide a TFT having a gate insulating film which has a high dielectric withstand voltage and can ensure a desired carrier mobility in an adjacent semiconductor active film. A gate electrode and a semiconductor active film are formed on a transparent substrate with a gate insulating film, which is formed of two layered insulating films, held between them. The gate insulating film is made up of a first gate insulating film which improves a withstand voltage between the gate electrode and the semiconductor active film, and a second gate insulating film which improves an interface characteristic between the gate insulating film and the semiconductor active film. The first and second gate insulating films are each formed of a $SiN_x$ film. The optical band gap of the first gate insulating film has a value in the range of 3.0 to 4.5 eV, and the optical band gap of the second gate insulating film has a value in the range of 5.0 to 5.3 eV.

4 Claims, 11 Drawing Sheets

THIN FILM TRANSISTOR, METHOD OF PRODUCING THE SAME, LIQUID CRYSTAL DISPLAY, AND THIN FILM FORMING APPARATUS

BACKGROUND OF THE INVENTION

1. Field of the Invention

The present invention relates to a thin film transistor, a method of producing the thin film transistor, a liquid crystal display, and a thin film forming apparatus. More particularly, the present invention relates to the structure of a gate insulating film in a thin film transistor of the reverse stagger type.

2. Description of the Related Art

FIG. 14 relates to a conventional ordinary liquid crystal display using thin film transistors (hereinafter referred to as TFTS), and illustrates one example of the structure of a TFT array board including TFTs of the reverse stagger type, gate lines, source lines, etc. In such a TFT array board, as shown in FIG. 14, gate lines 50 and source lines 51 are arranged on a transparent substrate in a matrix pattern. Each of. areas surrounded by the gate lines 50 and the source lines 51 serves as one pixel 52, and a TFT 53 is provided for each pixel 52. FIG. 15 is a sectional view showing a construction of the TFT 53.

In the TFT 53, as shown in FIG. 15, a gate electrode 55 leading out of the gate line 50 is formed on a transparent substrate 54, and a gate insulating film 56 is formed in covering relation to the gate electrode 55. A semiconductor active film 57 made of amorphous silicon (a-Si) is formed on the gate insulating film 56 at a position above the gate electrode 55. A source electrode 59 leads out of the source line 51 and a drain electrode 60 are formed to extend over the semiconductor active film 57 through an ohmic contact layer 58 which is made of amorphous silicon (a-Si:n$^+$) containing an n-type impurity such as phosphorous, and then on the gate insulating film 56. A passivation film 61 is formed in covering relation to the TFT 53 made up of the source electrode 59, the drain electrode 60, the gate electrode 55, etc., and a contact hole 62 is formed in the passivation film 61 at a position above the drain electrode 60. Further, a pixel electrode 63 formed of a transparent conductive film, such as indium tin oxide (hereinafter referred to as ITO), is filled in the contact hole 62 for electrical connection to the drain electrode 60.

Of the components of the TFT thus constructed, the gate insulating film located between the gate electrode and the semiconductor active film is the most important component that dominates electrical characteristics and reliability of the TFT. Also, the gate insulating film is an element that is responsible for the occurrence of surface defects. For an amorphous-silicon TFT using amorphous silicon as a material of the semiconductor active film, a redundant structure endurable against defects has been tried by employing a two-layered gate insulating film structure wherein gate insulating films are formed as two stacked layers using different materials and different methods. In one example of such a structure, the two stacked layers are a dense film of $Ta_2O_5$ formed by anode-oxidizing tantalum (Ta) of the gate electrode and a film of $Si_3N_4$ deposited by the plasma CVD.

Regarding electrical characteristics of the TFT, generally-demanded capabilities of the gate insulating film are represented by a dielectric withstand voltage and a carrier mobility in the semiconductor active film. The dielectric withstand voltage is a problem inherently depending on the gate insulating film itself, whereas the carrier mobility in the semiconductor active film is affected by an interface characteristic between the gate insulating film and the semiconductor active film.

The term "dielectric withstand voltage" means a maximum voltage until which the gate insulating film is endurable against dielectric breakdown in a test wherein the voltage applied between the gate electrode and the semiconductor active film is increased gradually. If the dielectric withstand voltage is lower than a desired design value, the gate insulating film would be liable to break down, thus resulting in an operation failure of the TFT and hence a display failure.

Also, the term "mobility" means an index indicating easiness in movement of carries within the TFT. A larger value of the mobility represents a greater driving ability and a higher-speed operation of the TFT. The mobility lowers if traveling of carriers is impeded due to disorder of a semiconductor crystal and the presence of impurities. Taking electrons in silicon as an example, the mobility of electrons is about 1000 $cm^2$/V·sec in a single crystal. However, the mobility lowers down to the order of 0–100 $cm^2$/V·sec in polycrystalline silicon, and further down to the order of 0.3–1 $cm^2$/V·sec in amorphous silicon. In other words, because the mobility lowers in the case of using amorphous silicon due to the inherent property, there has been a demand for maintaining the mobility as high as possible even to a small extent in such a case.

Although the dielectric withstand voltage and the carrier mobility are, as described above, important factors in achieving TFTs with good electrical characteristics and high reliability, the materials which have been usually employed for the gate insulating film in the past are not satisfactory from points of both the dielectric withstand voltage and the carrier mobility. Also, although it has been hitherto proposed to combine two kinds of layers for giving the gate insulating film desired capabilities like the above-mentioned example of the two-layered structure of $Ta_2O_5$ and $Si_3N_4$, this method has such problems that the step of forming the gate insulating film is complicated and the productivity of TFT array boards is deteriorated.

SUMMARY OF THE INVENTION

With the view of solving the problems set forth above, an object of the present invention is to provide a TFT having a gate insulating film which has a high dielectric withstand voltage and can ensure a desired carrier mobility in an adjacent semiconductor active film, a method of producing the TFT, a liquid crystal display which is superior in electrical characteristics and yield, as well as a thin film forming apparatus adaptable in the method of producing the TFT.

To achieve the above object, in the TFT of the present invention, a gate electrode and a semiconductor active film are formed on a substrate with a gate insulating film, which is formed of two layered insulating films, located therebetween, the gate insulating film being made up of a first gate insulating film which is disposed on the same side as the gate electrode and improves a withstand voltage between the gate electrode and the semiconductor active film, and a second gate insulating film which is disposed on the same side as the semiconductor active film and improves an interface characteristic between the gate insulating film and the semiconductor active film.

In other words, the TFT of the present invention intends to realize a gate insulating film which has in itself a desired dielectric withstand voltage and renders the semiconductor active film to have a desired carrier mobility, by forming the gate insulating film with two layered insulating films made of such materials as functioning respectively to improve the withstand voltage between the gate electrode and the semiconductor active film, and to improve the interface characteristic between the gate insulating film and the semiconductor active film. The phrase "improve the interface characteristic between the gate insulating film and the semiconductor active film" used herein means that the carrier mobility in the semiconductor active film is improved as a result of forming the second gate insulating film.

Concrete examples of the materials usable as the first and second gate insulating films are as follows. The first and second gate insulating films are each formed of a silicon nitride film, the optical band gap of the first gate insulating film has a value in the range of 3.0 to 4.5 eV, and the optical band gap of the second gate insulating film has a value in the range of 5.0 to 5.3 eV.

Heretofore, it has been customary that an insulating film having two different functions is formed of two layered films by using two different kinds of materials. However, the inventor has found that even films having the same composition, i.e., silicon nitride films, develop different characteristics if values of the optical band gap of the films are different from each other, and has accomplished the present invention based on the finding. The correlation between concrete numerical values of the optical band gap and characteristics of the gate insulating film will be described later in Examples.

A method of producing the TFT of the present invention, which includes a process of forming the gate insulating film having the above features, comprises the steps of preparing a plasma CVD apparatus including a radio-frequency electrode and a susceptor electrode disposed in opposed relation and installed in a film forming chamber; bringing a gas mixture of silane gas and ammonia gas into a plasma state under a desired radio-frequency electric field formed between the radio-frequency electrode and the susceptor electrode, thereby forming a first gate insulating film on a gate electrode formed on a substrate; bringing a gas mixture having the same composition as the above gas mixture into a plasma state under a greater radio-frequency electric field than the above radio-frequency electric field, thereby forming a second gate insulating film on the first gate insulating film; and forming a semiconductor active film on the second gate insulating film.

When the above method is employed, radio-frequency powers can be applied to the radio-frequency electrode and the susceptor electrode of the plasma CVD apparatus in any sequence of the following combinations. It is to be here noted that the power applied to the radio-frequency electrode is called excitation power and the power applied to the susceptor electrode is called substrate bias power.

(1) The substrate bias power is not applied both in forming the first gate insulating film and in forming the second gate insulating film, whereas the excitation power is set to be greater in forming the second gate insulating film than in forming the first gate insulating film.

(2) The equal substrate bias power is applied both in forming the first gate insulating film and in forming the second gate insulating film, whereas the excitation power is set to be greater in forming the second gate insulating film than in forming the first gate insulating film.

(3) The substrate bias power is set to be greater in forming the second gate insulating film than in forming the first gate insulating film, whereas the equal excitation power is applied both in forming the first gate insulating film than in forming the second gate insulating film.

(4) The substrate bias power is set to be greater in forming the second gate insulating film than in forming the first gate insulating film, whereas the excitation power is set to be greater in forming the second gate insulating film than in forming the first gate insulating film.

Of the above combinations, the cases of applying both the substrate bias power and the excitation power require the use of a two-frequency excitation plasma CVD apparatus.

Instead of the above method of using a gas mixture having the same composition as the gas mixture used in forming the first gate insulating film and forming the second gate insulating film under a greater radio-frequency electric field than in forming the first gate insulating film, the method of producing the TFT may comprise the steps of forming the first gate insulating film in the same manner as in the above method; bringing a gas mixture, in which silane gas and ammonia gas are mixed at such a mixing ratio as containing the ammonia gas at a greater proportion relative to the silane gas than in the mixture gas used in the preceding step, into a plasma state under a radio-frequency electric field having the same intensity as the radio-frequency electric field applied in forming the first gate insulating film, thereby forming a second gate insulating film on the first gate insulating film; and forming a semiconductor active film on the second gate insulating film.

Also, when the above method of changing over the composition of the gas mixture is employed, radio-frequency powers can be applied to the radio-frequency electrode and the susceptor electrode of the plasma CVD apparatus in any sequence of the above combinations (1) to (4).

With any of the above methods, the two layered gate insulating films having different characteristics can be formed successively and easily just by forming both the first and second gate insulating films of silicon nitride films, and changing over the radio-frequency power or the composition of the gas mixture at the time of shift from the first gate insulating film forming step to the second gate insulating film forming step. As a result, the step of forming the gate insulating film is not so complicated as the example of the two-layered structure of $Ta_2O_5$ and $Si_3N_4$ mentioned above in connection with the related art, and a TFT array board can be manufactured with productivity at a level not so lower than the case of forming a one-layer gate insulating film.

In the liquid crystal display of the present invention, a liquid crystal is held between a pair of substrates disposed in opposed relation, and one of the pair of substrates includes the above TFT.

The liquid crystal display of the present invention employs a TFT array board having the TFTs which provide a high dielectric withstand voltage between the gate electrode and the semiconductor active film, and ensure a great carrier mobility in the semiconductor active film. Therefore, a liquid crystal display can be realized which has a high response speed and is superior in yield and reliability.

The thin film forming apparatus of the present invention comprises a susceptor electrode disposed in opposed relation to a radio-frequency electrode and installed in a film forming chamber for supporting a substrate thereon, and a control unit for successively carrying out the steps of supplying a reactive gas to an inner space of the film forming chamber while exhausting the gas so as to maintain a desired pressure within the film forming chamber, and bringing the reactive gas into a plasma state under a first radio-frequency electric field formed between the radio-frequency electrode and the susceptor electrode, thereby forming a first coating on the substrate; and bringing the reactive gas into a plasma state under a greater second radio-frequency electric field than the first radio-frequency electric field while maintaining the plasma state between the radio-frequency electrode and the susceptor electrode, thereby forming a second coating on the surface of the first coating.

As means for producing the second radio-frequency electric field greater than the first radio-frequency electric field, second substrate bias power applied to the susceptor electrode in forming the second coating may be set to be greater than first substrate bias power applied to the susceptor electrode in forming the first coating, while desired plasma excitation power is applied to the radio-frequency electrode. Alternatively, second plasma excitation power applied to the radio-frequency electrode in forming the second coating may be set to be greater than first plasma excitation power applied to the radio-frequency electrode in forming the first coating.

Another thin film forming apparatus of the present invention comprises a susceptor electrode disposed in opposed relation to a radio-frequency electrode and installed in a film forming chamber for supporting a substrate thereon, and a control unit for successively carrying out the steps of supplying a first gas mixture of monosilane gas and ammonia gas, which are mixed at a first mixing ratio, to an inner space of the film forming chamber while exhausting the gas so as to maintain a desired pressure within the film forming chamber; bringing the first gas mixture into a plasma state under a radio-frequency electric field formed between the radio-frequency electrode and the susceptor electrode, thereby forming a first silicon nitride film on the substrate; and supplying a second gas mixture of monosilane gas and ammonia gas, which are mixed at such a second mixing ratio as containing the ammonia gas at a greater proportion than at the first mixing ratio, to the inner space of the film forming chamber while maintaining the plasma state between the radio-frequency electrode and the susceptor electrode, and bringing the second gas mixture into a plasma state to thereby form a second silicon nitride film on the surface of the first silicon nitride film.

With the thin film forming apparatus of the present invention, the two layered coatings having different characteristics can be formed successively in the single apparatus.

BRIEF DESCRIPTION OF THE DRAWINGS

FIG. 2 shows a process flow; namely.

DESCRIPTION OF THE PREFERRED EMBODIMENT

One embodiment of the present invention will be described below with reference to FIGS. 1 to 9.

Figure 1:
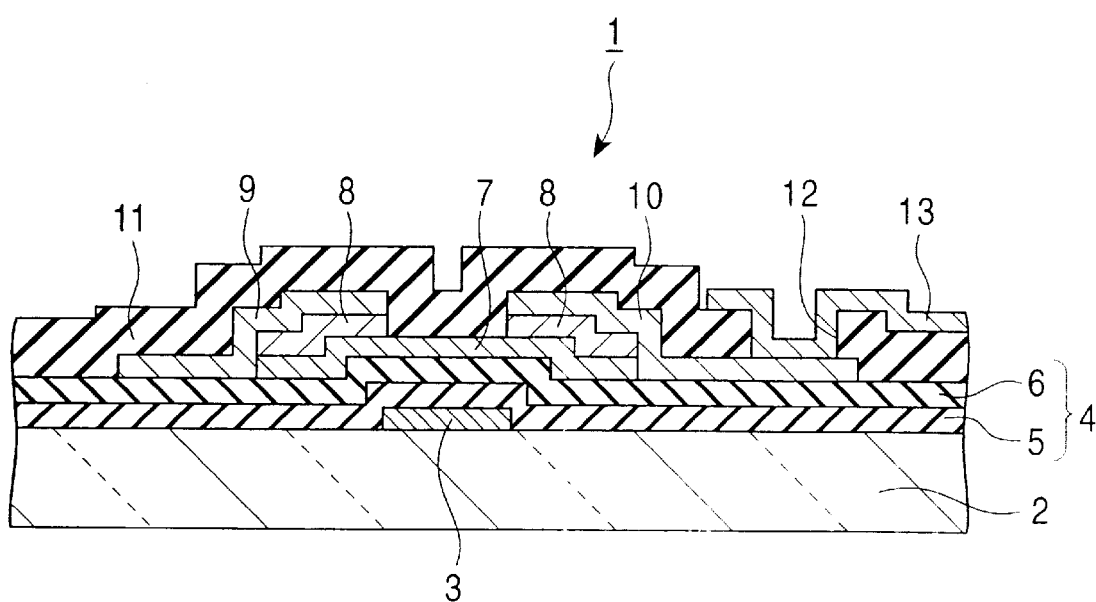
FIG. 1 is a sectional view showing the structure of a TFT according to one embodiment of the present invention.

FIG. 1 is a sectional view showing the structure of a TFT according to the embodiment, and illustrates one example of the reverse stagger type structure of a TFT.

In an illustrated TFT 1, as shown in FIG. 1, a gate electrode 3 made of a metal such as aluminum is formed on a transparent substrate 2, and a gate insulating film 4 made up of two layered insulating films is formed in covering relation to the gate electrode 3. A first gate insulating film 5 and a second gate insulating film 6, which constitute the gate insulating film 4, are each a film of silicon nitride ($SiN_x$). The first gate insulating film 5 has a value of optical band gap in the range of 3.0 to 4.5 eV, and the second gate insulating film 6 has a value of optical band gap in the range of 5.0 to 5.3 eV.

A semiconductor active film 7 made of amorphous silicon (a-Si) is formed on the gate insulating film 4 at a position above the gate electrode 3. A source electrode 9 and a drain electrode 10, each of which is made of a metal such as aluminum, are formed to extend over the semiconductor active film 9 through an ohmic contact layer 8 which is made of amorphous silicon (a-Si:n$^+$) containing an n-type impurity such as phosphorous, and then on the gate insulating film 4. A passivation film 11 is formed in covering relation to the TFT 1 made up of the source electrode 9, the drain electrode 10, the gate electrode 3, etc., and a contact hole 12 is formed in the passivation film 11 at a position above the drain electrode 10. Further, a pixel electrode 13 formed of a transparent conductive film, such as ITO, is filled in the contact hole 12 for electrical connection to the drain electrode 10.

The procedures for producing a TFT array board using the thus-constructed TFTs 1 will now be described with reference to FIG. 2.

Figure 2A:
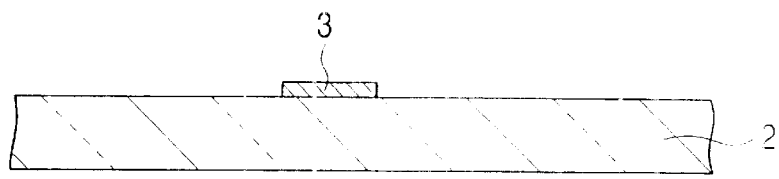
FIGS. 2A to 2E show successive steps of producing the TFT according to the embodiment.
Figure 2B:
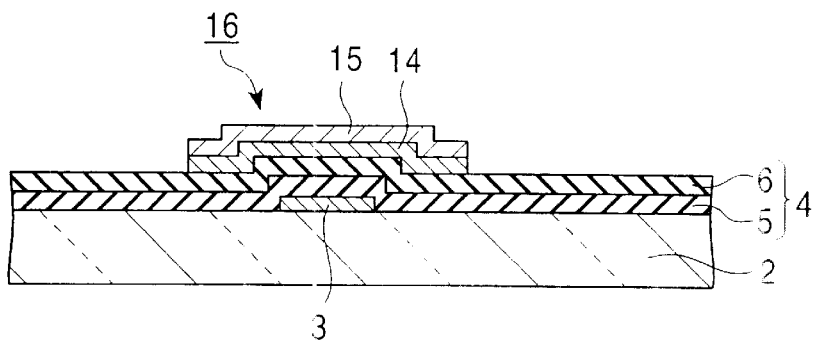

First, as shown in FIG. 2A, a conductive film is formed on the transparent substrate 2 and then patterned to form the gate electrode 3 and a gate line (not shown). Then, as shown in FIG. 2B, the gate insulating film 4 made up of the two layered $SiN_x$ films is formed in covering relation to the gate electrode 3. Thereafter, an a-Si film 14 and an a-Si:n$^+$ film 15 are formed successively in this order, and these films 14, 15 are patterned together using one photomask, thereby forming an island portion 16 over the gate electrode 3 through the gate insulating film 4.

A thin film forming apparatus used for forming the gate insulating film 4 made up of the two layered $SiN_x$ films will now be described.

Figure 3:
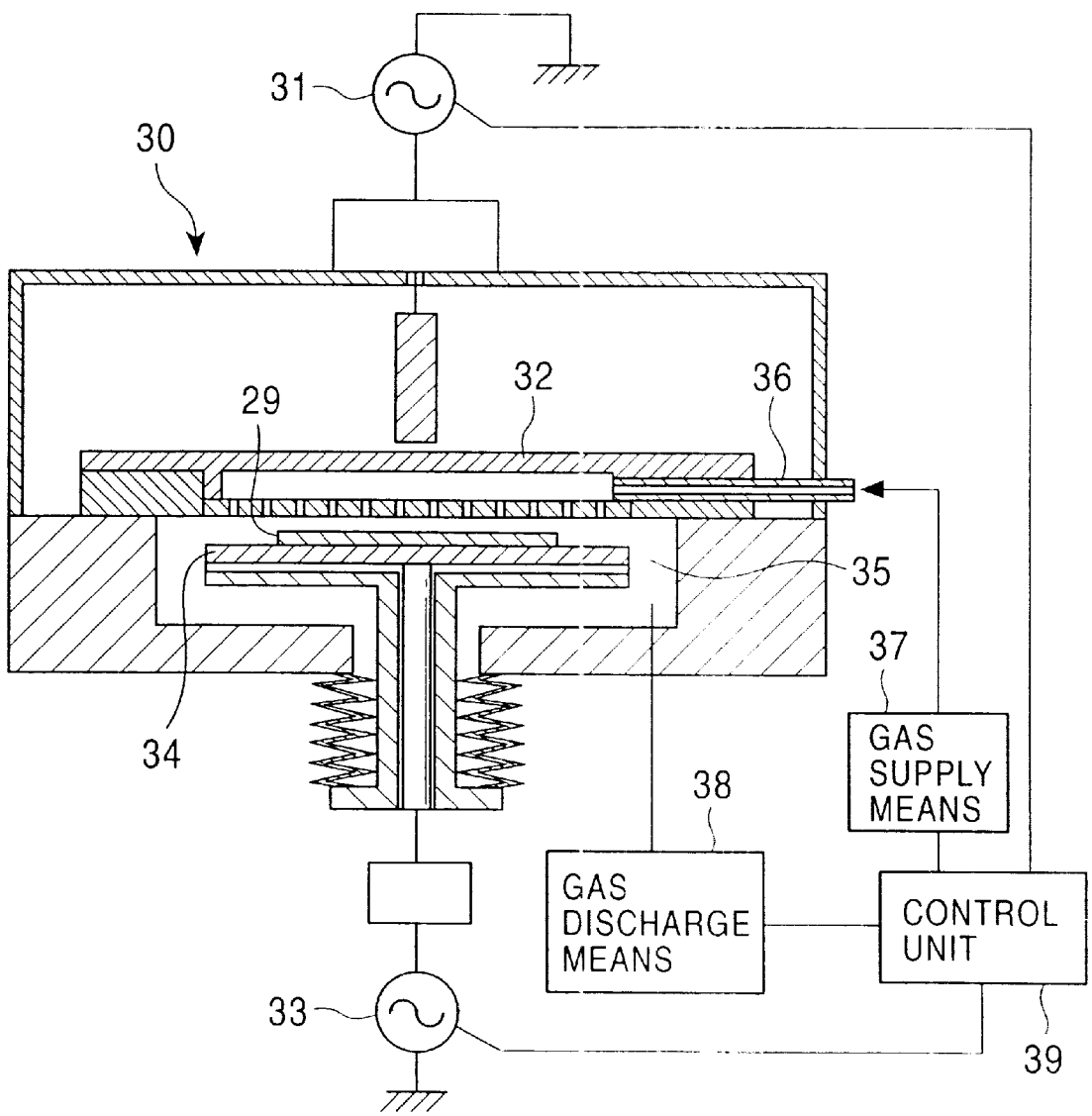
FIG. 3 is a schematic view showing a two-frequency excitation plasma CVD apparatus used in the embodiment.

FIG. 3 is a schematic view showing a two-frequency excitation plasma CVD apparatus 30 as a thin film forming apparatus according to the embodiment. In FIG. 3, numeral 31 denotes a plasma excitation power supply, 32 denotes a radio-frequency (RF) electrode, 33 denotes a bias power supply, 34 denotes a susceptor electrode, and 35 denotes a film forming chamber.

The two-frequency excitation plasma CVD apparatus 30 comprises, as shown in FIG. 3, the film forming chamber 35 capable of maintaining a vacuum atmosphere in its inner space, the RF electrode 32 and the susceptor electrode 34 for generating an RF electric field to produce plasma within the film forming chamber 35, the plasma excitation power supply 31 and the bias power supply 33 for supplying respective RF powers of predetermined frequencies to the electrodes 32 and 34, a heating means (not shown) for heating a substrate 29 placed on the susceptor electrode 34, a gas supply means 37 for supplying a desired gas to the inner space of the film forming chamber 35 through a gas introducing pipe 36, a gas discharge means 38 for discharging the gas in match with the gas supply to maintain a desired pressure within the film forming chamber 35, and a control unit 39 for controlling various components of the two-frequency excitation plasma CVD apparatus 30 including the heating means, the plasma excitation power supply 31, the bias power supply 33, the gas supply means 37, the gas discharge means 38, etc.

The two-frequency excitation plasma CVD apparatus 30 having the above-described construction is operated in any of the following two types of sequences according to programs stored in the control unit 39. These two types of sequences are optionally selectable by an operator.

Figure 4:
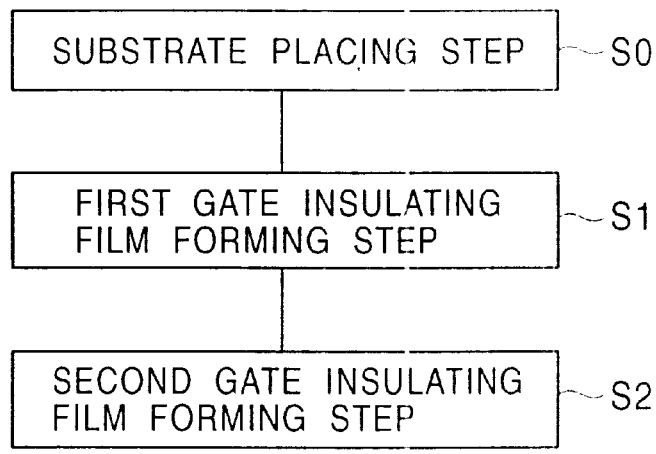
FIG. 4 is a flowchart showing a first sequence of the process carried out by the plasma CVD apparatus.

The first sequence comprises, as shown in FIG. 4, the steps of placing the substrate 29 on the susceptor electrode 34 which is provided to face the RF electrode 32 installed in the film forming chamber 35 (step S0 in FIG. 4); supplying a gas mixture of monosilane gas and ammonia gas to the inner space of the film forming chamber 35 while exhausting the gas so as to maintain the desired pressure within the film forming chamber 35, and bringing the gas mixture into a plasma state under a first RF electric field formed between the RF electrode 32 and the susceptor electrode 34, thereby forming the first gate insulating film 5 of $SiN_x$ on the substrate 29 (step S1 in FIG. 4); and bringing the gas mixture into a plasma state under a greater second RF electric field than the first RF electric field while maintaining the plasma state between the RF electrode 32 and the susceptor electrode 34, thereby forming the second gate insulating film 6 on the surface of the first gate insulating film 5 (step S2 in FIG. 4). The above steps are executed in squence to form the first gate insulating film 5 and the second gate insulating film 6 successively.

A means for producing the second RF electric field greater than the first RF electric field in the above first sequence can be realized by a method of setting the second substrate bias power applied to the susceptor electrode 34 in forming the second gate insulating film 6 to be greater than the first substrate bias power applied to the susceptor electrode 34 in forming the first gate insulating film 5, or a method of setting the second plasma excitation power applied to the RF electrode 32 in forming the second gate insulating film 6 to be greater than the first plasma excitation power applied to the RF electrode 32 in forming the first gate insulating film 5.

Figure 5:
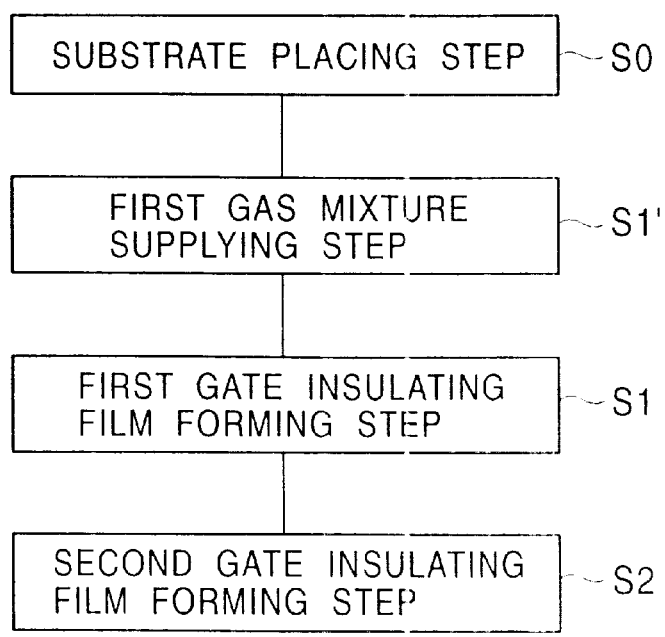
FIG. 5 is a flowchart showing a second sequence of the process carried out by the plasma CVD apparatus.

The second sequence comprises, as shown in FIG. 5, the steps of placing the substrate 29 on the susceptor electrode 34 which is provided to face the RF electrode 32 installed in the film forming chamber 35 (step S0 in FIG. 5); supplying a first gas mixture of monosilane gas and ammonia gas, which are mixed at a first mixing ratio, to the inner space of the film forming chamber 35 while exhausting the gas so as to maintain the desired pressure within the film forming chamber 35 (step S1' in FIG. 5); bringing the first gas mixture into a plasma state under an RF electric field formed between the RF electrode 32 and the susceptor electrode 34, thereby forming the first gate insulating film 5 of $SiN_x$ on the substrate 29 (step S1 in FIG. 5); and supplying a second gas mixture of monosilane gas and ammonia gas, which are mixed at such a second mixing ratio as containing the ammonia gas at a greater proportion than at the first mixing ratio, to the inner space of the film forming chamber 35 while maintaining the plasma state between the RF electrode 32 and the susceptor electrode 34, and bringing the second gas mixture into a plasma state to thereby form the second gate insulating film 6 of $SiN_x$ on the surface of the first gate insulating film 5 (step S2 in FIG. 5). The above steps are executed in sequence to form the first gate insulating film 5 and the second gate insulating film 6 successively.

Next, three concrete examples of forming the gate insulating film 4 made up of two layered $SiN_x$ films will be described.

As described above, the first gate insulating film 5 and the second gate insulating film 6 are each a $SiN_x$ film and can be formed successively using the two-frequency excitation plasma CVD apparatus 30. However, since the two $SiN_x$ films have different optical band gaps from each other, they require to be formed separately.

Figure 6:
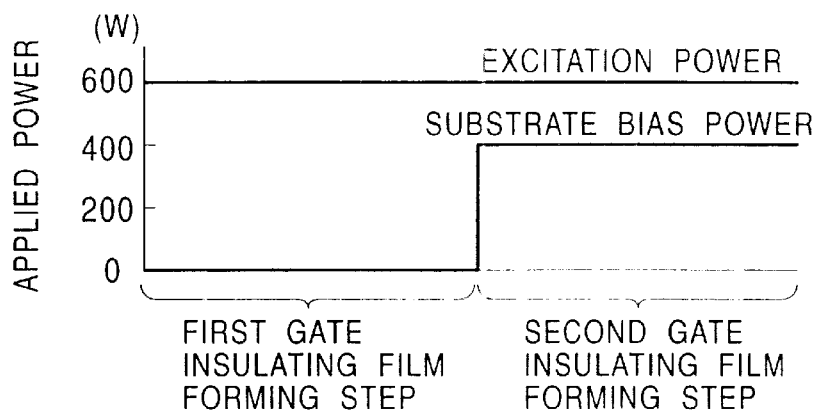
FIG. 6 is a chart for explaining a sequence of forming an gate insulating film of the TFT, the graph showing an example of a manner of changing substrate bias power.

The first example employs the above first sequence. In this method, as shown in FIG. 6, the substrate bias power applied to the susceptor electrode 34 supporting the substrate to be processed thereon is changed.

Concrete conditions for the film formation are as follows. The RF excitation power of 40.68 MHz applied to the RF electrode is held constant at 600 W, whereas the substrate bias power of 13.56 MHz is set to 0 W (non-applied state) in forming the first gate insulating film 5 and to 400 W in forming the second gate insulating film 6. During the process, the flow rate ratio of monosilane gas to ammonia gas, which are material gases for the $SiN_x$ films, is held constant at $NH_3/SiH_4$:160 sccm/40 sccm. The substrate temperature is held in the range of 250 to 300° C., and the pressure within the chamber is held at 150 Pa.

Figure 7:
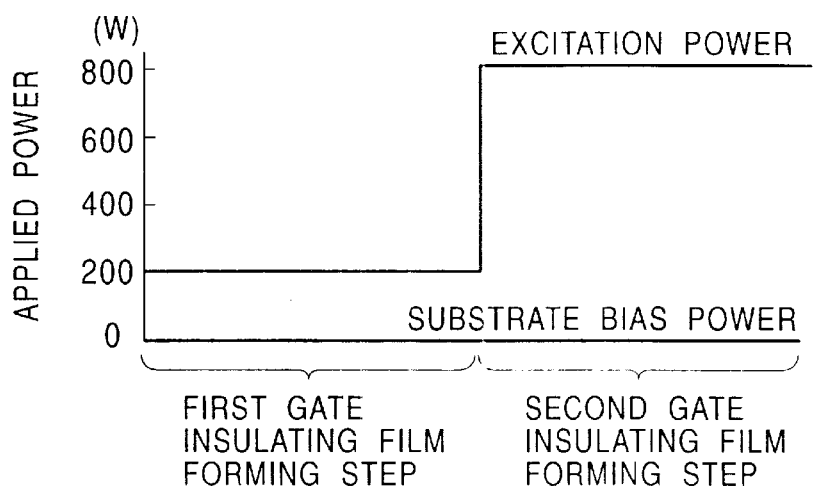
FIG. 7 is a chart for explaining a sequence of forming the gate insulating film of the TFT, the graph showing an example of a manner of changing RF excitation power.

The second example also employs the above first sequence. In this method, as shown in FIG. 7, the RF excitation power is changed.

Concrete conditions for the film formation are as follows. The substrate bias power is held constant at 0 W (non-applied state), whereas the RF excitation power is set to 200 W in forming the first gate insulating film 5 and to 800 W in forming the second gate insulating film 6. During the process, the flow rate ratio of monosilane gas to ammonia gas is held constant at $NH_3/SiH_4$:160 sccm/40 sccm. The substrate temperature is held in the range of 250 to 300° C., and the pressure within the chamber is held at 150 Pa.

Figure 8:
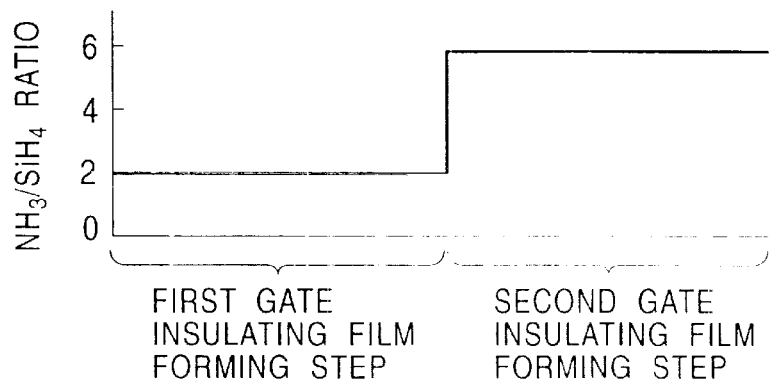
FIG. 8 is a chart for explaining a sequence of forming the gate insulating film of the TFT, the graph showing an example of a manner of changing a flow rate ratio of mixed gases.

The third example employs the above second sequence. In this method, as shown in FIG. 8, the flow rate ratio of monosilane gas to ammonia gas is changed.

Concrete conditions for the film formation are as follows. The flow rate ratio of monosilane gas to ammonia gas is set to $NH_3/SiH_4$:80 sccm/40 sccm in forming the first gate insulating film 5 and to $NH_3/SiH_4$:240 sccm/40 sccm in forming the second gate insulating film 6. During the process, the RF excitation power is held constant at 800 W and the substrate bias power is held constant at 100 W. The substrate temperature is held in the range of 250 to 300° C., and the pressure within the chamber is held at 150 Pa.

With any of the above three exemplified methods, it is possible to adjust a value of optical band gap of the first gate insulating film 5 to fall in the range of 3.0 to 4.5 eV, and to adjust a value of optical band gap of the second gate insulating film 6 to fall in the range of 5.0 to 5.3 eV.

Figure 2C:
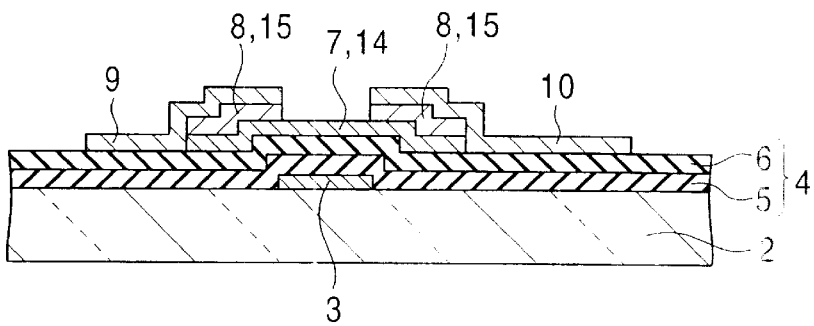

Returning to the process flow again, as shown in FIG. 2C, a conductive film is formed on the entire surface and then patterned to form the drain electrode 10, the source electrode 9 and the source line (not shown). A part of the a-Si:n$^+$ film 15 located above a channel portion of the a-Si film 14 is then removed to form the ohmic contact layer 8 provided by the a-Si:n$^+$ film 15.

Figure 2D:
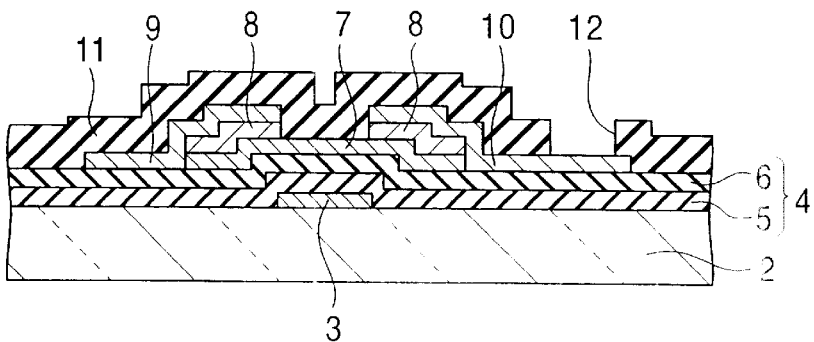
Figure 2E:
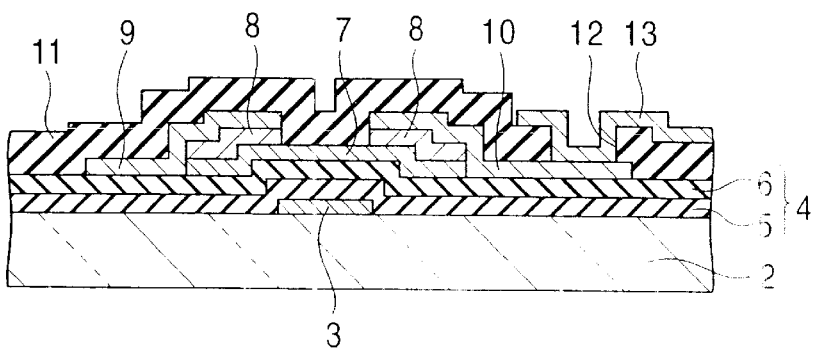

Next, as shown in FIG. 2D, the passivation film 11 is formed on the entire surface and then patterned to open a part of the passivation film 11 above the drain electrode 10, thereby forming the contact hole 12 for electrical connection between the drain electrode 10 and the pixel electrode 13. Finally, as shown in FIG. 2E, an ITO film is formed on the entire surface and then patterned to form the pixel electrode 13. Through the steps described above, the TFT array board of this embodiment is completed.

In the TFT 1 of this embodiment, as described above, the gate insulating film 4 is made up of the two layered $SiN_x$ films having different optical band gaps from each other. Of these $SiN_x$ films, the first gate insulating film 5 functions to improve a withstand voltage between the gate electrode 3 and the semiconductor active film 7, and the second gate insulating film 6 functions to improve an interface characteristic between the gate insulating film and the semiconductor active film 7. Accordingly, looking at the gate insulating film 4 as a whole, a gate insulating film can be realized which has in itself a desired dielectric withstand voltage and renders the semiconductor active film 7 to have a desired carrier mobility. As a result, a TFT being less susceptible to an operation failure and capable of high-speed operation is achieved.

With any of the above three examples used as the method of forming the gate insulating film 4, the two layered gate insulating films 5, 6 having different characteristics can be formed successively just by changing over the excitation power, the substrate bias power or the mixing ratio of the gas mixture at the time of shift from the first gate insulating film forming step to the second gate insulating film forming step. Thus, the TFT array board can be manufactured with productivity at a level not so lower than the case of forming a one-layer gate insulating film.

One example of a TFT type liquid crystal display using the TFT array board of this embodiment will be described below.

Figure 9:
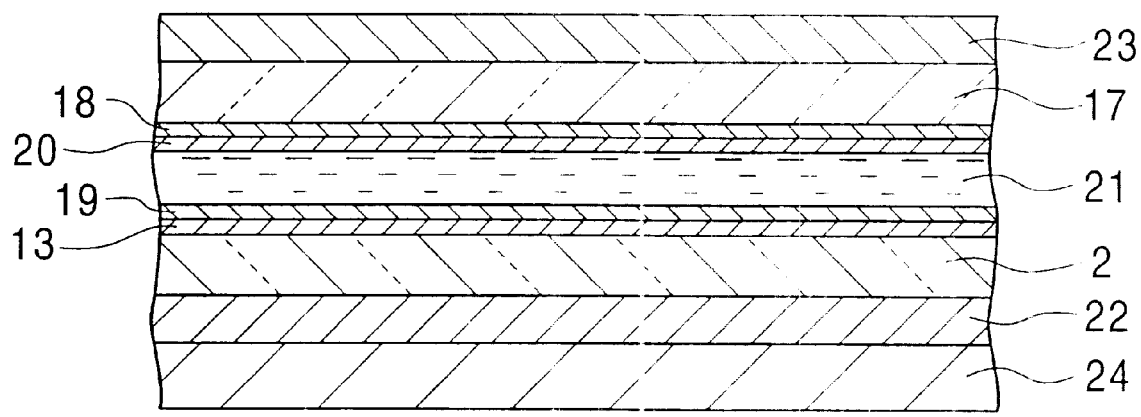
FIG. 9 is a sectional view showing the schematic construction of a liquid crystal display employing a TFT array board provided with the TFTs according to the embodiment.

In the liquid crystal display of this embodiment, as shown in FIG. 9, a pair of transparent substrates 2 and 17 are arranged in opposed relation. Of these transparent substrates, one substrate 2 is constituted by the TFT array board including the above-described TFTs 1, and the other substrate 17 serves as an opposite board. The pixel electrode 13 is provided on a surface of the TFT array board 2 facing the opposite board 17, and a common electrode 18 is provided on a surface of the opposite board 17 facing the TFT array board 2. Orientation films 19, 20 are provided on the pixel electrode 13 and the common electrode 18, respectively, with a liquid crystal layer 21 disposed between the orientation films 19, 20. First and second polarizing plates 22, 23 are provided outside the transparent boards 2, 17, respectively, and a backlight 24 is attached to the outer side of the first polarizing plate 22.

The TFTs 1 used in the TFT type liquid crystal display of this embodiment each provide a high dielectric withstand voltage between the gate electrode 3 and the semiconductor active film 7, and ensure a great carrier mobility in the semiconductor active film 7. Therefore, a liquid crystal display can be realized which has a high response speed and is superior in yield and reliability. In addition, since the first gate insulating film 5 of the TFT array, positioned on the same side as the backlight 24 has a high dielectric withstand voltage and serves to absorb ultraviolet rays, an adverse effect of light from the backlight 24 upon the TFT characteristics can be minimized.

It is to be noted that the technical scope of the present invention is not limited to the above-described embodiment, and the present invention can be modified in various ways without departing from the purport of the invention. For example, while the two-frequency excitation plasma CVD apparatus is employed in forming the two-layered gate insulating film in the above embodiment, the two-frequency excitation plasma CVD apparatus is not needed in the case of using a method of forming the first gate insulating film and the second gate insulating film without applying the substrate bias power, and an ordinary plasma CVD apparatus having only the RF electrode can be used. Further, while only three examples have been described as the methods of forming the gate insulating film, any of other suitable methods such as described in "Summary of the Invention" is also usable.

<Examples>

The correlation between the optical band gap of the gate insulating film and various characteristics in the TFT of the present invention was studied. Results of the studies are reported below.

First, how the optical band gap varies depending on values of the applied RF power in forming the gate insulating film was studied. Using the two-frequency excitation plasma CVD apparatus, $SiN_x$ films were formed while the RF excitation power ($Rf_1$) of 40.68 MHz was changed to four values, i.e., 200, 400, 600 and 800 arb. (arb. represents an arbitrary unit) and the substrate bias power ($Rf_2$) of 13.56 MHz was changed from 0 arb. to 400 arb. for each value of the RF excitation power. The optical band gap of each of the formed $SiN_x$ films was measured. As other conditions for the film formation, the flow rate ratio of material gases was set to $SiH_4/NH_3/N_2$:40 sccm/160 sccm/600 sccm, the substrate temperature was set to 300° C., and the pressure within the chamber was set to 250 Pa. Measured results are plotted in FIG. 10.

Figure 10:
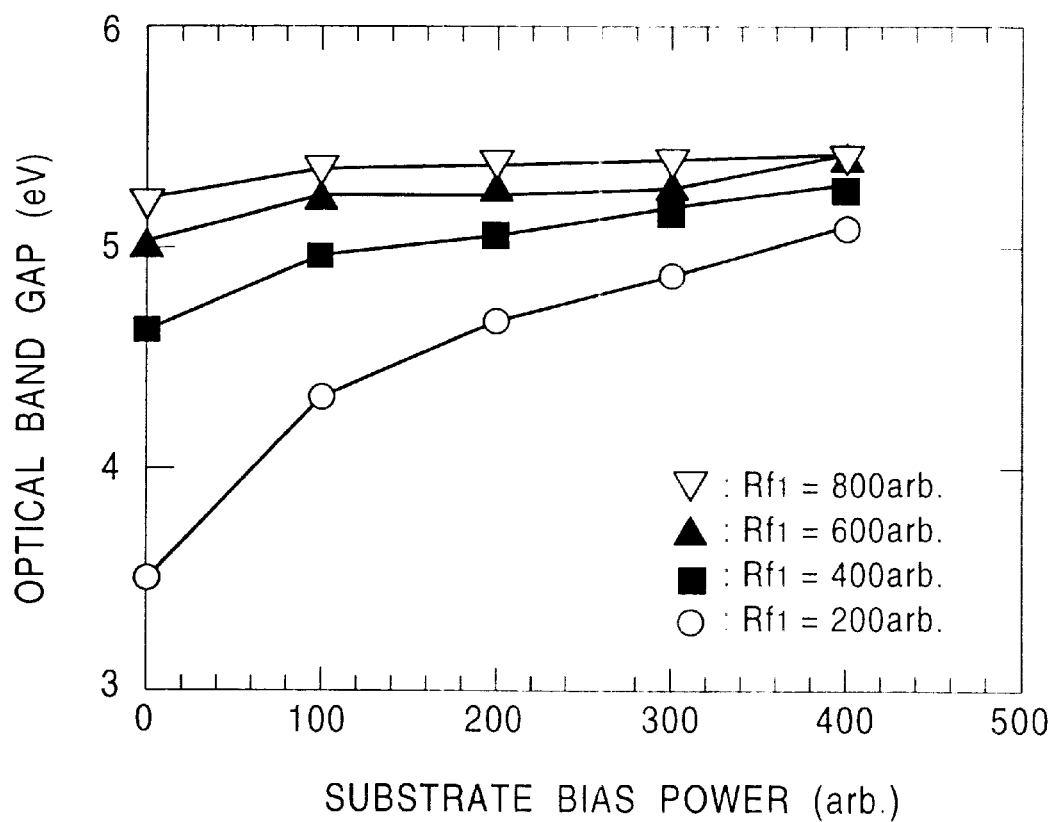
FIG. 10 is a graph of experimental data showing the correlation between the substrate bias power and the optical band gap in a process of film formation according to the embodiment of the present invention.

In FIG. 10, the horizontal axis represents the substrate bias power (arb.) during the formation of each film, and the vertical axis represents the optical band gap (eV) of each film. Also, marks "○" in FIG. 10 denote data resulted at the RF excitation power ($Rf_1$) of 200 arb., marks "■" denote data resulted at $Rf_1$ of 400 arb., marks "▲" denote data resulted at $Rf_1$ of 600 arb., and marks "▽" denote data resulted at $Rf_1$ of 800 arb.

It was found from the results of FIG. 10 that when the RF excitation power ($Rf_1$) was set to 200 arb., the optical band gap of the $SiN_x$ film took a value in the range of 3.5 to 4.5 eV by forming the film with the substrate bias power ($Rf_2$) set to a value in the range of 0 to 200 arb.

Next, $SiN_x$ films were formed by setting the RF excitation power ($Rf_1$) to 0, 100, 200 and 300 arb. while the substrate bias power ($Rf_2$) was changed from 0 arb. to 500 arb. The dielectric withstand voltage was measured for each of the formed $SiN_x$ films.

Figure 11:
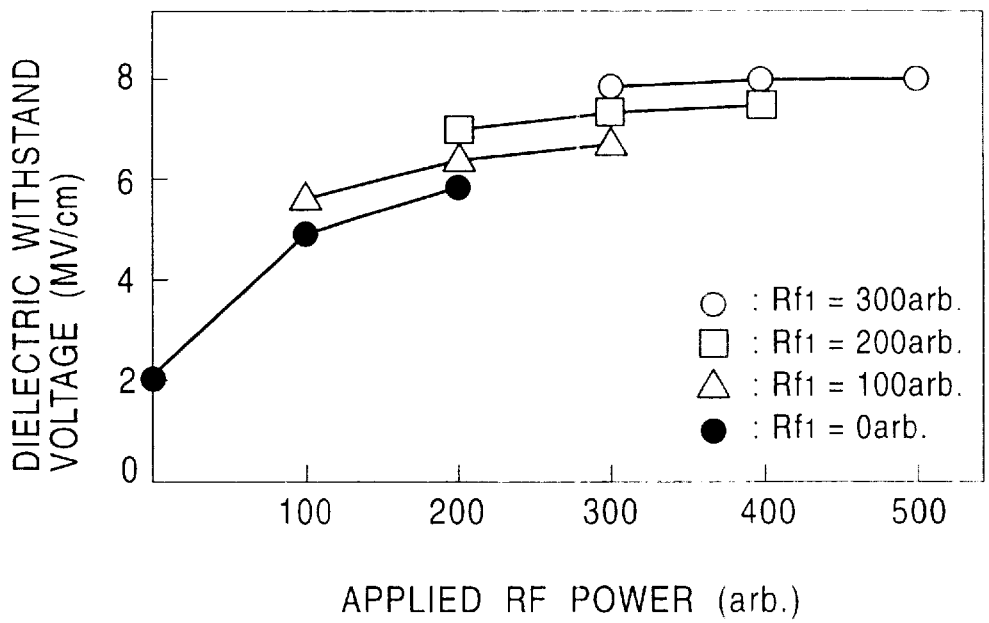
FIG. 11 is a graph of experimental data showing the correlation between the applied RF power and the flat-portion dielectric withstand voltage in the process of film formation according to the embodiment of the present invention.

In the experiment, the dielectric withstand voltage was measured in accordance with two patterns, i.e., a "flat-portion withstand voltage measurement pattern" in which a first conductive film with a thickness of 1300 Å, a $SiN_x$ film with a thickness of 1300 Å and a second conductive film with an arbitrary thickness were stacked on a substrate in a sectional structure, and the dielectric withstand voltage was measured in a flat portion of the $SiN_x$ film between the first and second conductive films each having a predetermined area and being rectangular in plan view; and a "stepped-portion withstand voltage measurement pattern" in which the first and second conductive films were each formed linearly in crossed relation, and the dielectric withstand voltage was measured in a stepped (level-difference) portion of the $SiN_x$ film where the first and second conductive films cross each other. FIG. 11 shows measured results of the flat-portion dielectric withstand voltage, and FIG. 12 shows measured results of the stepped-portion dielectric withstand voltage.

Figure 12:
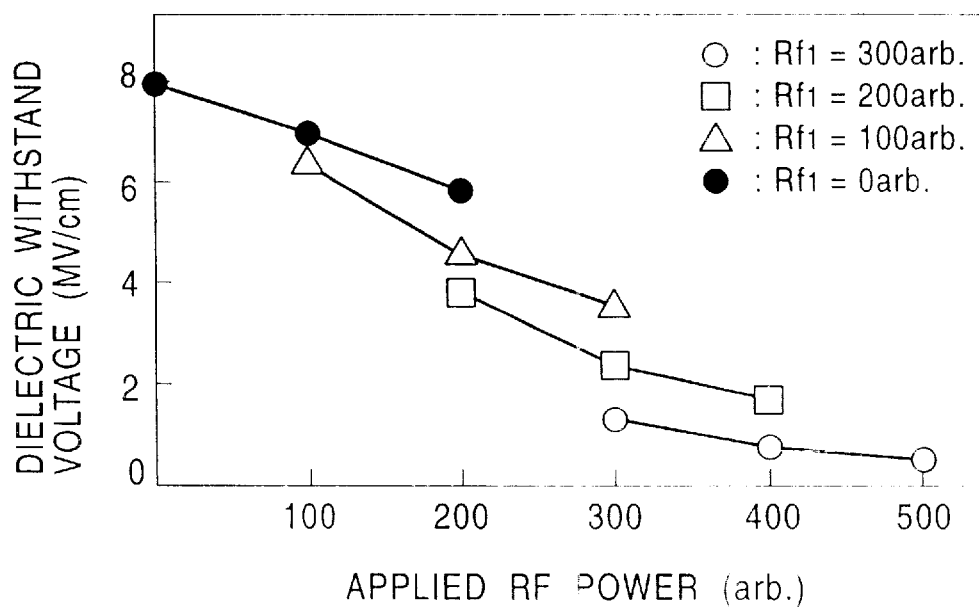
FIG. 12 is a graph of experimental data showing the correlation between the applied RF power and the stepped-portion dielectric withstand voltage in the process of film formation according to the embodiment of the present invention.

In FIGS. 11 and 12, the horizontal axis represents the applied RF power (arb.: the term "applied RF power" means the total of the RF excitation power ($Rf_1$) and the substrate bias power ($Rf_2$)) during the formation of each film, and the vertical axis represents the dielectric withstand voltage (MV/cm). In the measurement, the RF excitation power ($Rf_1$) was set to 0, 100, 200 and 300 arb. In both FIGS. 11 and 12, marks "●" denote data resulted at the RF excitation power ($Rf_1$) of 0 arb., marks "Δ" denote data resulted at $Rf_1$ of 100 arb., marks "■" denote data resulted at $Rf_1$ of 200 arb., and marks "○" denote data resulted at $Rf_1$ of 300 arb.

In the measurement of the flat-portion dielectric withstand voltage shown in FIG. 11, the dielectric withstand voltage was about 2 MV/cm when the applied RF power was 0 arb., and increased to about 8 MV/cm as the applied RF power was increased to 500 arb. On the other hand, from the measurement of the stepped-portion dielectric withstand voltage shown FIG. 12 which represents more strict evaluation of the dielectric withstand voltage, it was found that the dielectric withstand voltage had values in the range of 6 to 8 MV/cm when the applied RF power was in the range of 0 to 200 arb., but reduced down below 1 MV/cm as the applied RF power was increased to 500 arb., whereby the desired withstand voltage was not obtained.

Considering the withstand voltage of the gate insulating film in a TFT of the reverse stagger type, in particular, the gate insulating film is necessarily stepped at the end of a gate electrode, and breakdown of the gate insulating film is more apt to occur due to concentration of an electrical field in such a stepped portion. From the viewpoint of ensuring the normal operation of the TFT, it is therefore important that the dielectric withstand voltage is high particularly at the stepped portion.

For that reason, the applied RF power in the process of film formation is preferably held in the range of 0 to 200 arb. Judging from the results of FIGS. 10 to 12 comprehensively, it was proved that when the optical band gap of the $SiN_x$ film had a value in the range of 3.5 to 4.5 eV, the $SiN_x$ film showed a satisfactory dielectric withstand voltage, particularly in the stepped portion of the gate electrode, and a TFT having high reliability was obtained.

Further, several $SiN_x$ films having different optical band gaps from each other were formed, and the field effect mobility was measured using each of the formed $SiN_x$ films. Two types of samples were prepared by changing the pressure within the chamber in the process of forming the $SiN_x$ film (marks "●" in FIG. 13 denote the samples prepared at the pressure $P_1$Pa and marks "■" in FIG. 13 denote the samples prepared at the pressure $P_2$Pa), and were subject to measurement of the field effect mobility. Measured results are shown in FIG. 13.

Figure 13:
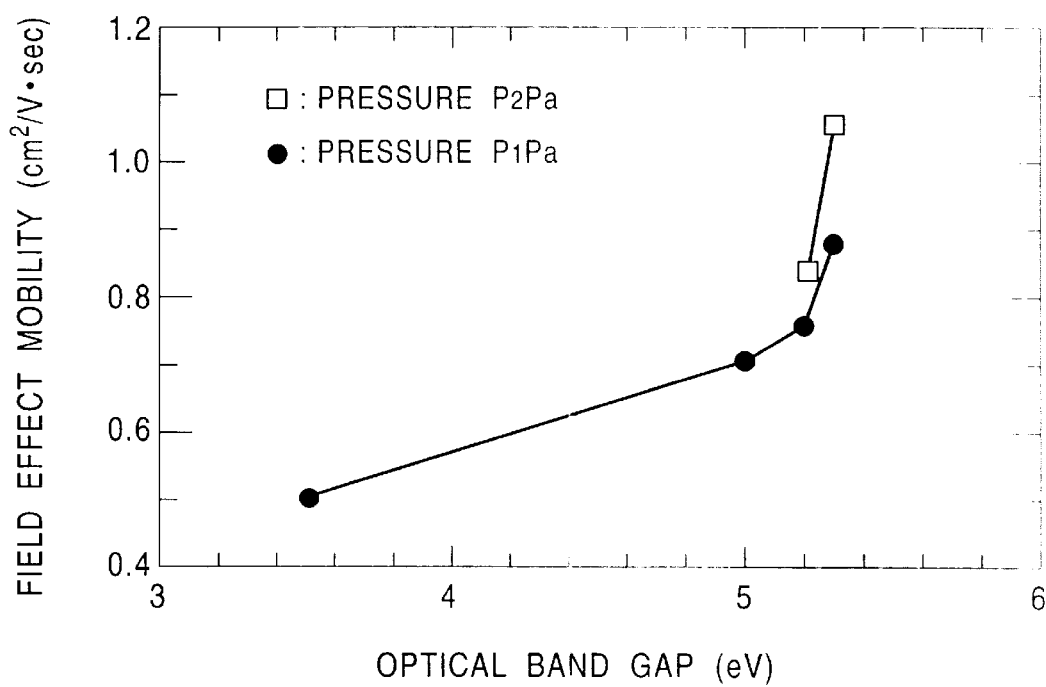
FIG. 13 is a graph of experimental data showing the correlation between the optical band gap and the field effect mobility in the embodiment of the present invention.
Figure 14:
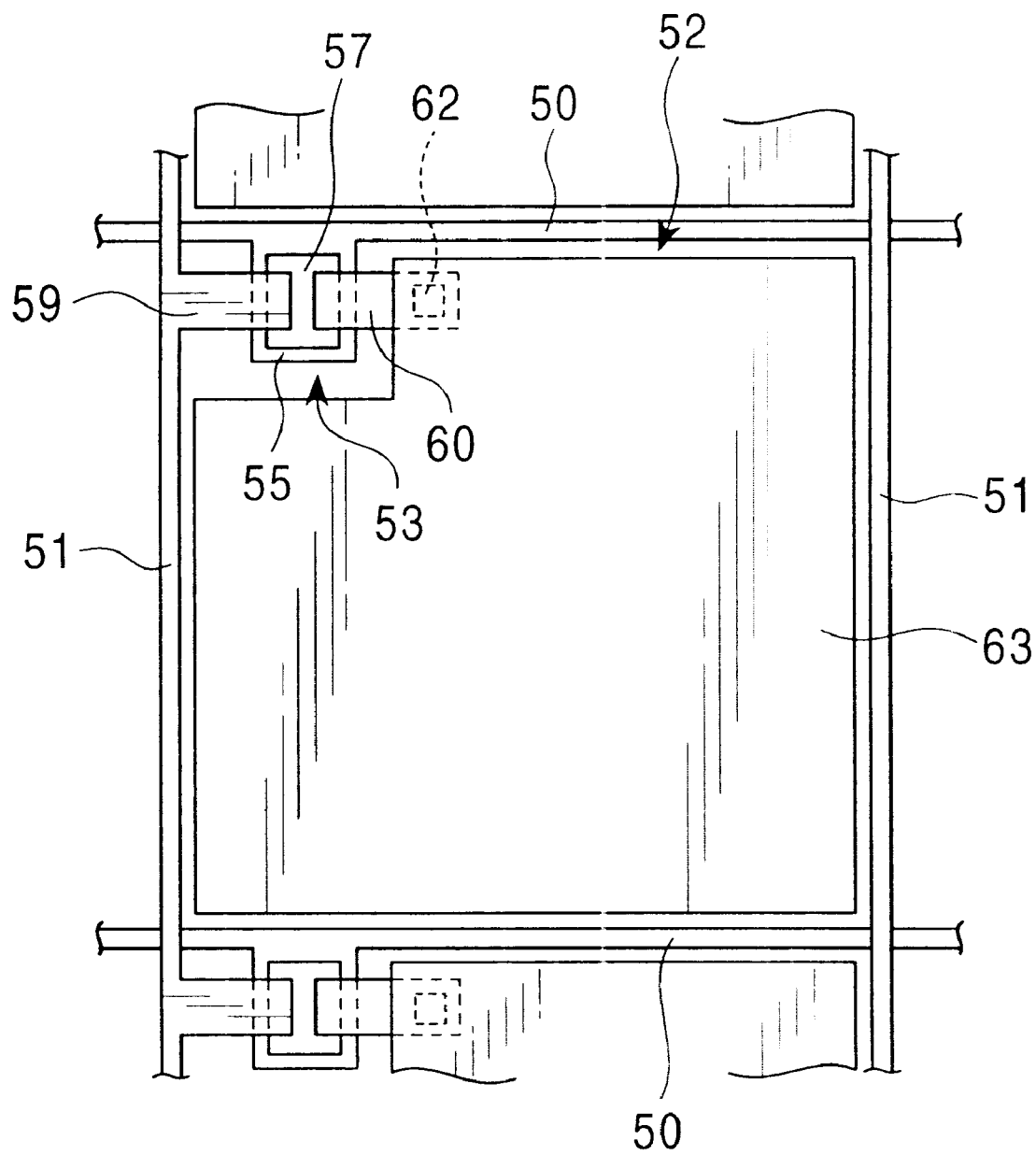
FIG. 14 is a plan view showing the schematic construction of a general liquid crystal display.
Figure 15:
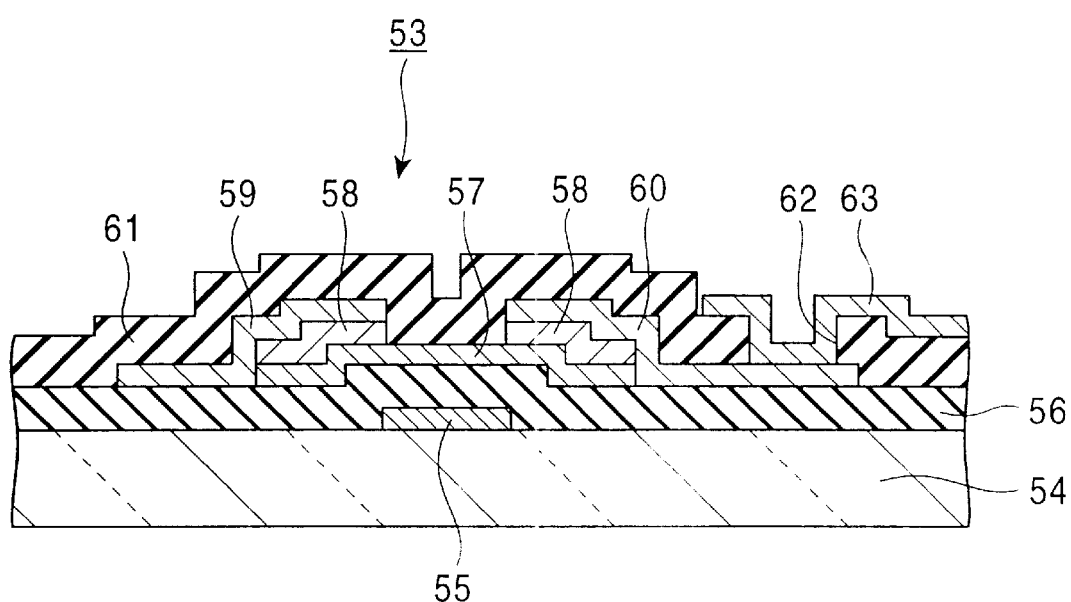
FIG. 15 is a sectional view showing the structure of a conventional TFT.

In FIG. 13, the horizontal axis represents the optical band gap (eV) of each film, and the vertical axis represents the field effect mobility ($cm^2$/V·sec). It was found from the results shown in FIG. 13 that when the optical band gap is in the range of 3.5 to 5.0 eV, the field effect mobility has a tendency to gently increase with an increase of the optical band gap. On the other hand, when the optical band gap exceeded 5.0 eV, the field effect mobility started to increase abruptly, and when the optical band gap reached 5.3 eV, the field effect mobility had a value of approximately of 1.0 $cm^2$/V·sec that was about twice the value resulted when the optical band gap was 3.5 eV. It was thus proved that using the $SiN_x$ film having the optical band gap in the range of 5.0 to 5.3 eV is preferable from the viewpoint of improving the carrier mobility.

According to the present invention, as described above in detail, the first gate insulating film functions to improve a withstand voltage between the gate electrode and the semiconductor active film, and the second gate insulating film functions to improve an interface characteristic between the gate insulating film and the semiconductor active film. Therefore, looking at the gate insulating film as a whole, a gate insulating film can be realized which has in itself a desired dielectric withstand voltage and renders the semiconductor active film to have a desired carrier mobility. As a result, a TFT being less susceptible to an operation failure and capable of high-speed operation is achieved. Further, with the method of forming the gate insulating film according to the present invention, the two layered gate insulating films having different characteristics can be formed successively just by changing over the excitation power, the substrate bias power or the mixing ratio of the gas mixture at the time of shift from the first gate insulating film forming step to the second gate insulating film forming step. Thus, the TFT array board can be manufactured with productivity at a level not so lower than the case of forming a one-layer gate insulating film. Moreover, with the thin film forming apparatus according to the present invention, the excitation power, the substrate bias power or the mixing ratio of the gas mixture can be changed from one level to the other level at the time of shift from the first gate insulating film forming step to the second gate insulating film forming step, and the two layered gate insulating films having different characteristics can be formed successively. It is thus also possible to manufacture the TFT array board with productivity at a level not so lower than the case of forming a one-layer gate insulating film. In addition, according to the present invention, a liquid crystal display can be realized which has a high response speed and is superior in yield and reliability.

What is claimed is:

1. A thin film transistor wherein a gate electrode and a semiconductor active film are formed on a substrate with a gate insulating film, which is formed of two layered insulating films, located therebetween, said gate insulating film being made up of a first gate insulating film which is disposed on the same side as said gate electrode and improves a withstand voltage between said gate electrode and said semiconductor active film, and a second gate insulating film which is disposed on the same side as said semiconductor active film and improves an interface characteristic between said gate insulating film and said semiconductor active film, wherein said first and second gate insulating films are each formed of a silicon nitride film, the optical band gap of said first gate insulating film has a value in the range of 3.0 to 4.5 eV, and the optical band gap of said second gate insulating film has a value in the range of 5.0 to 5.3 eV, and the first gate insulating film has a dielectric withstand voltage in the range of 6 to 8 MV/cm.

2. A liquid crystal display wherein a liquid crystal is held between a pair of substrates disposed in opposed relation, and one of said pair of substrates includes a thin film transistor according to claim 1.

3. A thin film transistor comprising:

a substrate;

a gate electrode formed on the substrate;

a semiconductor active film over the gate electrode; and a layered gate insulating film formed between the gate electrode and the semiconductor active film, the layered gate insulating film including a first gate insulating film having an optical band gap of 3.0 to 4.5 eV and a dielectric withstand voltage of 6 to 8 MV/cm and a second gate insulating film of 5.0 to 5.3 eV.

4. A liquid crystal display wherein a liquid crystal is held between a pair of substrates disposed in opposed relation, and one of said pair of substrates includes the thin film transistor according to claim 3.

* * * * *

UNITED STATES PATENT AND TRADEMARK OFFICE
CERTIFICATE OF CORRECTION

PATENT NO.     : 6,355,943 B1
DATED          : March 12, 2002
INVENTOR(S)    : Chae Gee Sung It is certified that error appears in the above-identified patent and that said Letters Patent is hereby corrected as shown below:

<u>Title page,</u>
Item [56], U.S. PATENT DOCUMENTS, insert the following:
-- 5,567,633   10/1996   Gosain et al. --.

Signed and Sealed this

First Day of April, 2003

JAMES E. ROGAN
*Director of the United States Patent and Trademark Office*